United States Patent
Carlson, Jr. et al.

(10) Patent No.: US 10,595,438 B1
(45) Date of Patent: Mar. 17, 2020

(54) RUGGED DIGITAL MASS STORAGE DEVICE

(71) Applicant: AgylStor, Inc., San Jose, CA (US)

(72) Inventors: Frederic Roy Carlson, Jr., Pacific Palisades, CA (US); Krishnan C. Iyer, Fremont, CA (US); Erik J. Christensen, Modesto, CA (US)

(73) Assignee: AGYLSTOR, INC., San Jose, CA (US)

( * ) Notice: Subject to any disclaimer, the term of this patent is extended or adjusted under 35 U.S.C. 154(b) by 0 days.

(21) Appl. No.: 16/362,059

(22) Filed: Mar. 22, 2019

(51) Int. Cl.
| H05K 7/20 | (2006.01) |
| H05K 1/14 | (2006.01) |
| H05K 1/02 | (2006.01) |
| H05K 5/00 | (2006.01) |

(52) U.S. Cl.
CPC ......... *H05K 7/2039* (2013.01); *H05K 1/0203* (2013.01); *H05K 1/141* (2013.01); *H05K 5/0056* (2013.01); *H05K 7/20336* (2013.01); *H05K 7/20309* (2013.01); *H05K 7/20318* (2013.01); *H05K 2201/049* (2013.01); *H05K 2201/066* (2013.01); *H05K 2201/10159* (2013.01); *H05K 2201/10409* (2013.01)

(58) Field of Classification Search
None
See application file for complete search history.

(56) References Cited

U.S. PATENT DOCUMENTS

| 6,166,908 | A * | 12/2000 | Samaras ............. H05K 5/0269 165/104.33 |
| 8,111,516 | B2 * | 2/2012 | Goldrian ............ H05K 7/20727 165/80.1 |
| 8,665,601 | B1 * | 3/2014 | Mangay-Ayam, Jr. .. G11C 5/04 361/752 |
| 9,398,720 | B1 * | 7/2016 | Frank ................. H05K 7/20136 |
| 9,405,338 | B2 * | 8/2016 | Demange ................. G06F 1/20 |
| 2011/0228474 | A1 * | 9/2011 | Leibowitz ............... G06F 1/186 361/689 |
| 2013/0308266 | A1 * | 11/2013 | Sullivan .................... G06F 1/20 361/679.46 |
| 2015/0245533 | A1 * | 8/2015 | Wright ................. H05K 7/2039 361/56 |
| 2015/0277512 | A1 * | 10/2015 | Davis ...................... G06F 1/183 361/679.31 |
| 2017/0099735 | A1 * | 4/2017 | Takai ..................... H05K 1/141 |
| 2017/0220505 | A1 * | 8/2017 | Breakstone ......... G06F 11/2015 |
| 2018/0242469 | A1 * | 8/2018 | Suzuki ................... G06F 1/182 |
| 2019/0104632 | A1 * | 4/2019 | Nelson ............... H05K 7/20727 |
| 2019/0286197 | A1 * | 9/2019 | Khan .................. H05K 7/1427 |

* cited by examiner

*Primary Examiner* — Xanthia C Cunningham
(74) *Attorney, Agent, or Firm* — Cooley LLP

(57) ABSTRACT

An apparatus has a mother board with external connectors on a first side and flash memory connectors on a second side. Flash memory cards are connected to the flash memory connectors. Each flash memory card has flash memory and a flash memory controller. A thermal dissipation assembly is provided for each flash memory card. The thermal dissipation assembly includes a heat plate with a first end adjacent to the flash memory controller and a second end adjacent to the flash memory. A heat sink is attached to the flash memory cards at the second end. A polymer surrounds the external connectors and fully encloses remaining portions of the first side of the mother board, and fully encloses the flash memory cards, the thermal dissipation assembly and the heat sink.

8 Claims, 4 Drawing Sheets

US 10,595,438 B1

RUGGED DIGITAL MASS STORAGE DEVICE

FIELD OF THE INVENTION

This invention relates generally to computing systems. More particularly, this invention is directed toward a rugged digital mass storage device.

BACKGROUND OF THE INVENTION

Growing volumes of digital content from video sources, network connected sensors and ever expanding connected computers require new data storage solutions. More particularly, there is a need to store and access vast amounts of data, meaning at least 16 terra ($10^{12}$) bytes of data and up to peta ($10^{15}$) bytes of data. Such a system should be rugged, secure and have high input/output speeds.

SUMMARY OF THE INVENTION

An apparatus has a mother board with external connectors on a first side and flash memory connectors on a second side. Flash memory cards are connected to the flash memory connectors. Each flash memory card has flash memory and a flash memory controller. A thermal dissipation assembly is provided for each flash memory card. The thermal dissipation assembly includes a heat plate with a first end adjacent to the flash memory controller and a second end adjacent to the flash memory. A heat sink is attached to the flash memory cards at the second end. A polymer surrounds the external connectors and fully encloses remaining portions of the first side of the mother board, and fully encloses the flash memory cards, the thermal dissipation assembly and the heat sink.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
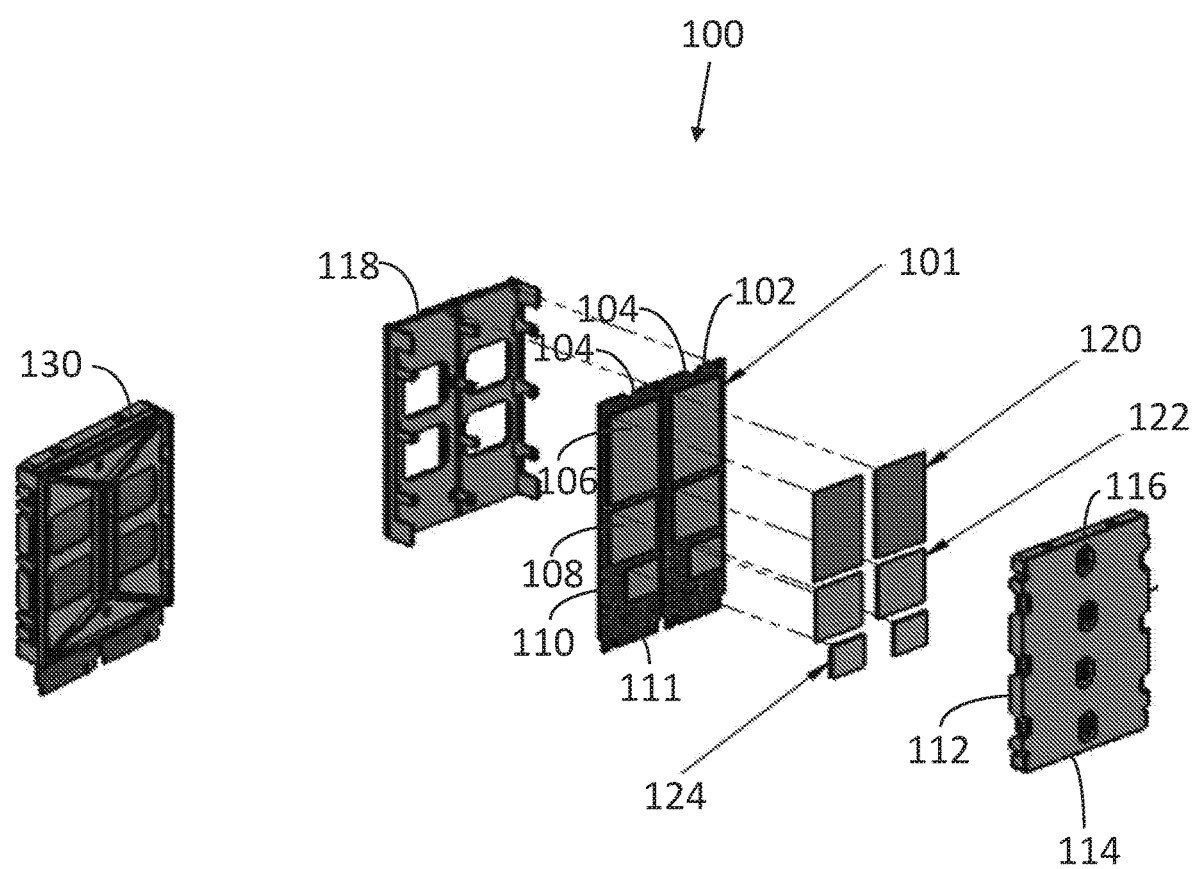
FIG. 1 is an exploded view of a flash memory thermal dissipation module configured in accordance with an embodiment of the invention.

FIG. 1 is an exploded view of a flash memory thermal dissipation module 100 configured in accordance with an embodiment of the invention. A flash memory card 101 has a flash memory printed circuit board 102 that includes at least one flash memory bank 104 comprising flash memory 106 and a flash memory controller 110. The flash memory controller 110 may include one or more of a processor, random access memory, a field programmable gate array and/or a complex programmable logic device.

Ancillary circuitry 108 may also be present, such as random access memory, power circuitry and the like. The flash memory printed circuit board 102 also has flash memory connectors 111.

A flash memory thermal dissipation assembly includes at least a heat plate 112. A first end 114 is positioned adjacent to the flash memory controller 110, while a second end 116 is positioned adjacent to the flash memory 106. The heat plate 112 may be solid metal. Alternately, the heat plate may be a heat pipe.

The flash memory controller 110 produces relatively large amounts of heat. In the case of a heat pipe, the heat is used to evaporate a working fluid within the heat pipe. The evaporated working fluid migrates to the top of the heat pipe, where it condenses at the second end 116, and thereby transports heat to the top of the flash memory thermal dissipation module 100. The same heat migration path exists in the case of a solid metal heat plate.

The flash memory thermal dissipation assembly may also include a heat plate clamp 118. Thermal interfaces may also be employed, such as a flash memory thermal insulating putty 120, an ancillary circuit thermal insulating putty 122 and a flash memory thermal insulating putty 124. The thermal insulating putty is electrically insulating, but thermally conductive. To exploit the thermally conductive property of the putty, the flash memory controller thermal insulating putty 124 is thicker (e.g., 1 mm) than the flash memory thermal insulating putty 120 (e.g., 0.3 mm). The ancillary circuit thermal insulating putty 122 may be an intermediate thickness (e.g., 0.5 mm).

Figure 2:
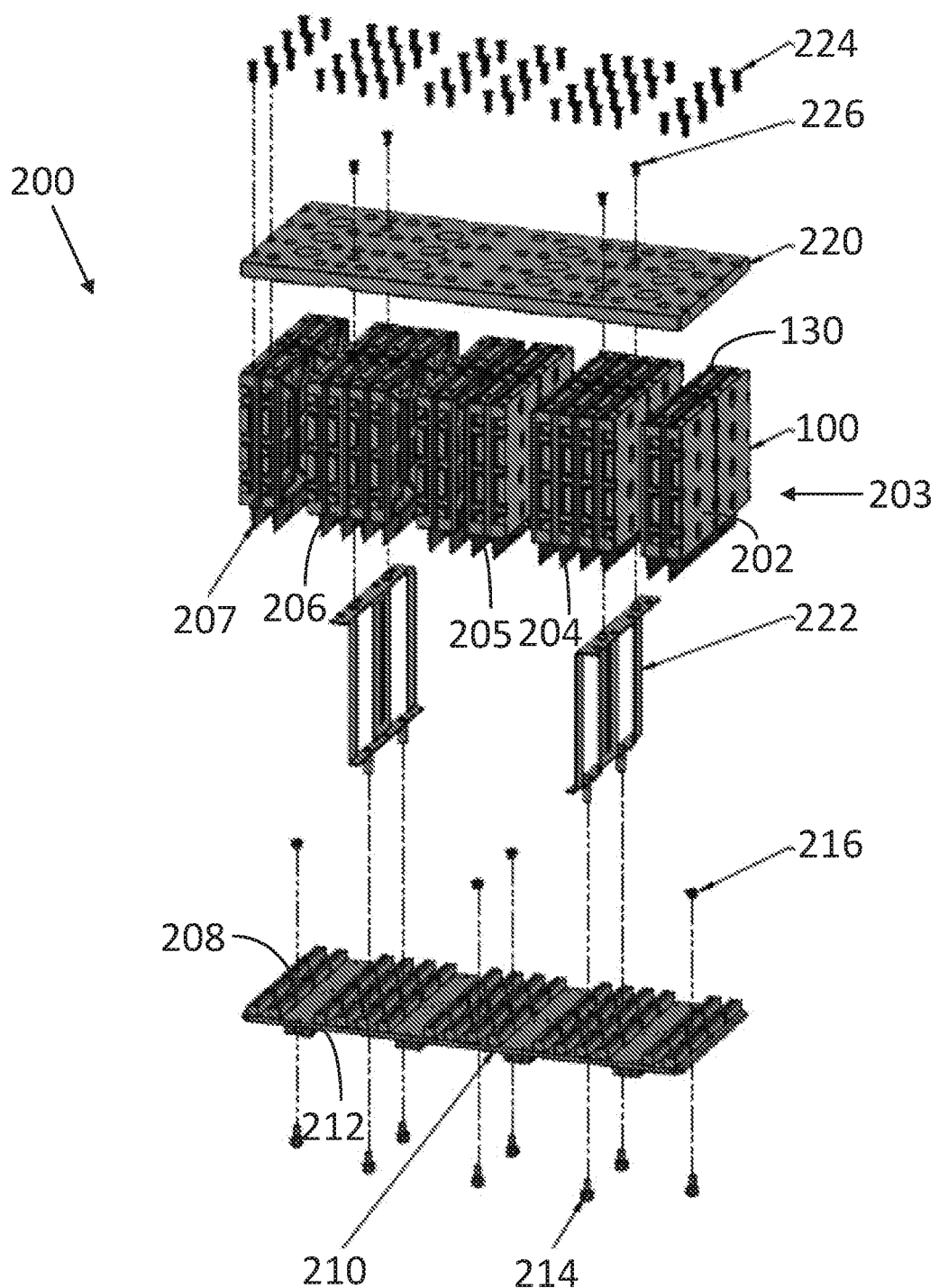
FIG. 2 is an exploded view of a rugged digital mass storage device configured in accordance with an embodiment of the invention.

FIG. 1 illustrates an assembled flash memory thermal dissipation module 130 that is axially adjacent to module 100, as is more fully appreciated with reference to FIG. 2.

FIG. 2 is an exploded view of a rugged digital mass storage device 200 configured in accordance with an embodiment of the invention. The figure illustrates flash memory thermal dissipation module 100 and axially adjacent flash memory thermal dissipation module 130. The flash memory thermal dissipation module 100 has a laterally adjacent flash memory thermal dissipation module 202. Flash memory thermal dissipation module 100 is part of an assembly 203 of four modules. The figure also illustrates three assemblies 204, 205, 206 each with eight modules and assembly 207 with four modules, for a total of 32 flash memory thermal dissipation modules. Thus, it can be appreciated that this is a highly dense configuration of electronic components, which results in the consumption of significant electricity, such as 500 Watts. This results in significant accumulations of heat (e.g., 300° to 400° F.), which must be thermally dissipated. Each flash memory thermal dissipation module participates in this process.

FIG. 2 illustrates a mother board 208 with external connectors 212 on a first side and flash memory connectors 210 on a second side. The flash memory connectors 111 engage the flash memory connectors 210. The mother board 208 receives motherboard screws 214 and associated nuts 216.

FIG. 2 also illustrates a heat sink 220. The heat sink 220 is at the second end of the heat plates 112. In one embodiment, the heat sink 220 is held in place with a heat sink support bracket 222, which is also attached to the motherboard 208. Heat sink screws 224 and 226 are also used to secure the heat sink 220. The heat sink 220 is formed of a dense metal. The heat sink 220 collects heat from the second ends (e.g., condenser end) of the heat plates 112 and thereby participates in the process of migrating heat away from the heat producing electronic components, particularly the flash memory controllers 110.

Figure 3:
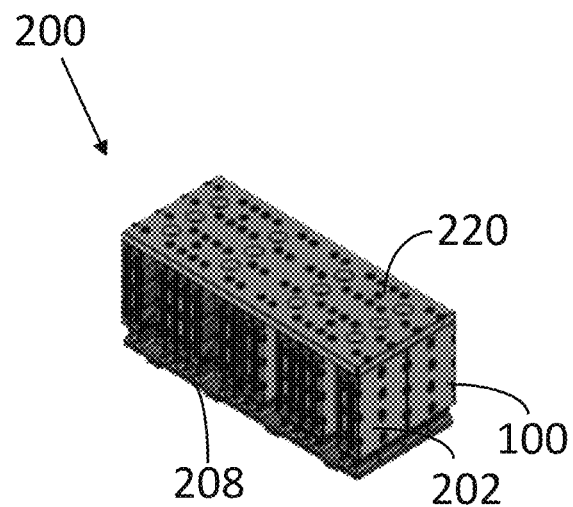
FIG. 3 is a top perspective view of an assembled rugged digital mass storage device configured in accordance with an embodiment of the invention.

FIG. 3 is a top perspective view of an assembled rugged digital mass storage device 200. The figure illustrates heat sink 220, flash memory thermal dissipation module 100 laterally adjacent flash memory thermal dissipation module 202 and mother board 208.

Figure 4:
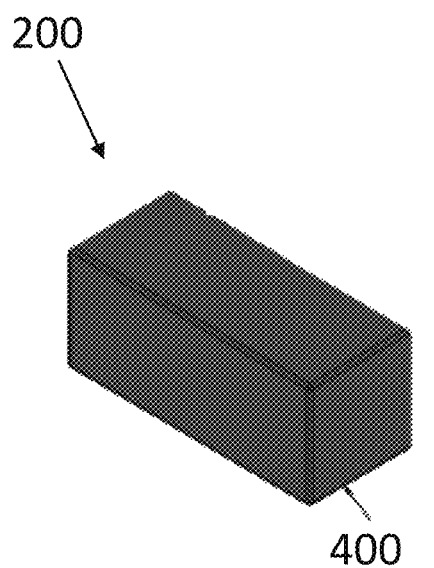
FIG. 4 is a top perspective view of a post-cast rugged digital mass storage device configured in accordance with an embodiment of the invention.

FIG. 4 is a top perspective view of a post-cast rugged digital mass storage device 200. A polymer 400 surrounds external connectors 212 (shown in FIG. 6), and fully encloses all remaining components. This results in a rugged and secure system. That is, the polymer provides protection against shocks and vibrations. The polymer also provides security since access to the electronic components is not practical. Embodiments of the invention omit moving parts, which fosters longevity of the device and also makes the device less susceptible to shocks and vibrations. However, the complete encasing of the electronic components creates challenging heat dissipation issues, which are resolved with the disclosed technology.

Figure 5:
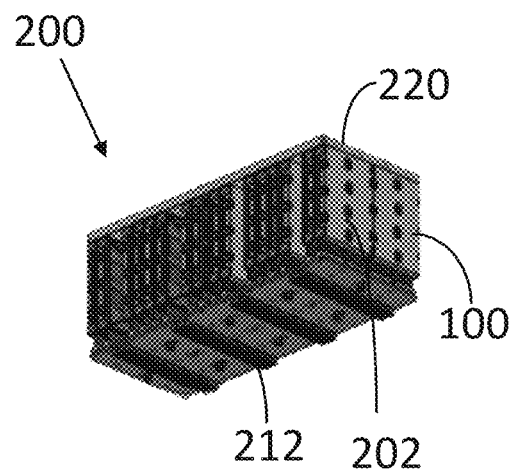
FIG. 5 is a bottom perspective view of an assembled rugged digital mass storage device configured in accordance with an embodiment of the invention.

FIG. 5 is a bottom perspective view of an assembled rugged digital mass storage device 200. The figure illustrates heat sink 220, flash memory thermal dissipation assembly 100, laterally adjacent flash memory thermal dissipation module 202 and external connectors 212.

Figure 6:
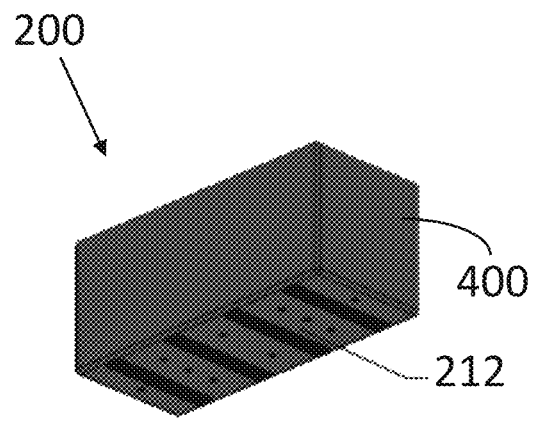
FIG. 6 is a bottom perspective view of a post-cast rugged digital mass storage device configured in accordance with an embodiment of the invention.

FIG. 6 is a bottom perspective view of a post-cast rugged digital mass storage device 200. A polymer 400 surrounds external connectors 212 and fully encloses all remaining components. This results in a rugged and secure system.

The exposed connectors 212 allow for hot swaps into and out of trays of host systems. In one embodiment, two storage devices 200 are positioned on a tray, which also hosts 32 servers and 32 100G ports. Thus, the device 200 has high input/output speeds.

In one embodiment the device 200 has an axial length of 9 inches, a height of 4 inches and a width of 4 inches. The device 200 provides a minimum memory capacity of 16 terra bytes, but can be configured for 50 terra bytes and more.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
    a mother board with external connectors on a first side and flash memory connectors on a second side;
    flash memory cards connected to the flash memory connectors, each flash memory card comprising flash memory and a flash memory controller;
    a thermal dissipation assembly for each flash memory card, the thermal dissipation assembly including a heat plate having first end adjacent to the flash memory controller and a second end adjacent to the flash memory;
    a heat sink attached to the flash memory cards at the second end; and
    a polymer surrounding the external connectors and fully enclosing remaining portions of the first side of the mother board, and fully enclosing the flash memory cards, the thermal dissipation assembly and the heat sink.

2. The apparatus of claim 1 further comprising a heat sink support bracket attached to the mother board and the heat sink.

3. The apparatus of claim 1 wherein the thermal dissipation assembly further comprises a heat plate clamp connected to the heat plate, the heat plate clamp and heat plate encasing the flash memory card.

4. The apparatus of claim 2 wherein the thermal dissipation assembly further comprises flash memory thermal insulating putty positioned between the flash memory and the heat plate and flash memory controller thermal insulating putty positioned between the flash memory controller and the heat plate, wherein the flash memory thermal insulating putty is thicker than the flash memory thermal insulating putty.

5. The apparatus of claim 1 wherein the flash memory cards provide a minimum memory capacity of 16 terra bytes.

6. The apparatus of claim 1 in a configuration with an axial length of 9 inches, a height of 4 inches and a width of 4 inches.

7. The apparatus of claim 1 wherein the heat plate is solid metal.

8. The apparatus of claim 1 wherein the heat plate is a heat pipe with an evaporator at the first end and a condenser at the second end.

\* \* \* \* \*